United States Patent
Chen et al.

(10) Patent No.: US 6,542,346 B1
(45) Date of Patent: Apr. 1, 2003

(54) HIGH-VOLTAGE TOLERANCE INPUT BUFFER AND ESD PROTECTION CIRCUIT

(75) Inventors: Wei-Fan Chen, Taichung (TW); Shu-Chuan Lee, Changhua (TW); Ta-Lee Yu, Hsinchu Hsien (TW); Shi-Tron Lin, Taipei (TW)

(73) Assignee: Winbond Electronics Corp. (TW)

( * ) Notice: Subject to any disclaimer, the term of this patent is extended or adjusted under 35 U.S.C. 154(b) by 51 days.

(21) Appl. No.: 09/586,568

(22) Filed: Jun. 2, 2000

(30) Foreign Application Priority Data

Dec. 20, 1999 (TW) .......................... 88122395 A

(51) Int. Cl.[7] .............................. H02H 3/22; H02H 9/04
(52) U.S. Cl. .................... 361/111; 361/56; 257/355; 327/313
(58) Field of Search .................... 361/56, 91.1–91.7, 361/111, 127; 327/313; 341/136; 307/296.1; 365/185.03; 331/177 V; 257/355–357

(56) References Cited

U.S. PATENT DOCUMENTS

| 4,833,342 A | * | 5/1989 | Kiryu et al. ............. 307/296.1 |
| 5,339,078 A | * | 8/1994 | Vernon ....................... 341/136 |
| 5,559,479 A | * | 9/1996 | Ohmori et al. ......... 331/177 V |
| 5,617,283 A | * | 4/1997 | Krakauer et al. ............. 361/56 |
| 5,703,807 A | * | 12/1997 | Smayling et al. ...... 365/185.03 |
| 5,781,388 A | * | 7/1998 | Quigley ....................... 361/56 |
| 6,066,973 A | * | 5/2000 | Sekino et al. ............... 327/313 |
| 6,337,787 B2 | * | 1/2002 | Tang ........................... 361/56 |

* cited by examiner

*Primary Examiner*—Kim Huynh
(74) *Attorney, Agent, or Firm*—Birch, Stewart, Kolasch & Birch, LLP

(57) ABSTRACT

A high-voltage tolerance input buffer and a high-voltage ESD protection circuit connected to a pad of an integrated circuit for preventing rapid gate oxide aging. The high-voltage tolerance input buffer of the present invention comprises a voltage-sharing circuit and a switch circuit, wherein the voltage-sharing circuit is connected between the pad and a power rail and generates a reference voltage not higher than the voltage of the pad. The switch circuit is connected to the voltage-sharing circuit and comprises a control gate to control the switching operation of the switch circuit according to the reference voltage. The present invention can be implemented to solve the rapid gate oxide aging problem without incurring any change in the original process flow by employing a voltage-sharing circuit.

10 Claims, 8 Drawing Sheets ically the region 26 shown in FIG. 3) is over-stressed
HIGH-VOLTAGE TOLERANCE INPUT BUFFER AND ESD PROTECTION CIRCUIT

BACKGROUND OF THE INVENTION

1. Field of the Invention

The present invention generally relates to a high-voltage tolerance input buffer that can sustain an input signal having a voltage level higher than the power source of the input buffer as well as a ESD protection circuit thereto pertained.

2. Description of the Related Art

As the feature size of a semiconductor chip is decreased due to advancements in the semiconductor manufacturing technology, the voltage level of the integrated circuit (IC) carried by the chip is also decreased. Nonetheless, a system provider, such as a computer motherboard manufacturer, will need to solve the problem of integrating ICs of different voltage levels each manufactured by a different process or technology, into one useful circuit. For example, the input buffer of an IC manufactured by a more advanced technology may not correctly receive the output signal of another IC manufactured by a less advanced technology. In addition, since the voltage level of the more advanced IC is typically lower than that of the less advanced IC, the input buffer of the more advanced IC therefore can not be sufficiently protected during circuit integration. In spite of the above-mentioned integration problem, it is inevitable that the system providers will need to find a way for coping with the different voltage levels of different ICs while trying to keep the cost down. Therefore, a high-voltage tolerance input buffer capable of sustaining an input signal with a voltage level higher than the power source of the input buffer has now been devised by industrial practices as a general solution for solving the above problems.

Referring to FIG. 1, FIG. 1 illustrates an input buffer of a prior art. The input buffer shown in FIG. 1 employs two clamping diodes 10 and 12 for clamping the voltage of a pad 14 into the inner circuit 16, which prevents the voltage received by the inner circuit 16 from being higher than the power rail VDD or lower than the power rail VSS. However, when the input buffer 10 in FIG. 1 receives a direct current (DC) input signal higher than VDD, the power VDD will be forced to charge-up, which causes a malfunction in the inner circuit 16. It therefore implies that the input buffer 10 in FIG. 1 can never be a high-voltage tolerance input buffer.

Referring to FIG. 2 and FIG. 3, FIG. 2 illustrates another prior art where an input buffer is provided with two semiconductor control rectifiers (SCRs). FIG. 3 is a cross-section of one of the semiconductor control rectifiers illustrated in FIG. 2. The input buffer shown as a prior art not only is a cause for malfunction but also a cause for gate oxide aging. If a voltage signal higher than the VDD is present at the pad 14, all the nodes electrically connected to the pad 14, such as the gate of NMOS 18 and the two terminals of the two semiconductor control rectifiers (SCRs) 20, will receive the same higher voltage signal. Because the gate oxide of an IC is always designed to sustain the highest differential voltage allowable in the IC for manufacturing considerations, which is the differential voltage between the VDD and the grounded VSS. As a result, the higher voltage signal at the pad 14 will tend to be over-stressed, causing a rapid aging of the gate oxide in the NMOS 18 (or more specifically in the region 22 shown in FIG. 2), which can turn into a reliability problem. By the same token, the NMOS 24 of the SCR 20, as shown in FIG. 3, also faces the same problems of over-stressing and rapid aging. In particular, the gate of MOS 24 will receive the same higher voltage signal as present at the pad 14. As a result, the gate oxide (or more specifically the region 26 shown in FIG. 3) is over-stressed since the P-substrate is typically grounded.

Referring to FIG. 4, FIG. 4 illustrates a high-voltage tolerance input buffer of another prior art. As a solution for solving the gate oxide-aging problem, a depletion MOS 32 is added in series between the pad 14 and the inner circuit 30 to shielft the inner circuit 30 from the conduction of any voltage higher than the VDD. However, in order to implement the depletion MOS, one more mask and several more additional process stes will need to be inserted into the original process flow, which can dramatically increase the production cost.

SUMMARY OF THE INVENTION

Therefore, it is an object of the present invention to provide a high-voltage tolerance input buffer for solving the problem integrating ICs of different voltage levels in a circuit without incurring any change in the relating semiconductor manufacturing process. By incorporating a smart circuit design of the present invention, the voltage at the gate of the NMOS can be safeguarded to levels not higher than the power VDD, thus rapid aging of the gate oxide can be prevented.

Accordingly, the present invention achieves the above-indicated object by providing a high-voltage tolerance input buffer which is coupled to the pad of an integrated circuit. Furthermore, the high-voltage tolerance input buffer comprises a voltage-sharing circuit and a switch circuit, wherein the voltage-sharing circuit is coupled between the pad and a power rail and generates a reference voltage not higher than the voltage of the pad. On the other hand, the switch circuit is coupled to the voltage-sharing circuit, which comprises a control gate to control the switching of the switch circuit according to the reference voltage.

The present invention further provides a high-voltage tolerance electrostatic discharge (ESD) protection circuit, which is coupled to the pad of an integrated circuit. The high-voltage ESD protection circuit comprises a voltage-sharing circuit and a semiconductor control rectifier (SCR), wherein the voltage-sharing circuit is coupled between the pad and a power rail and generates a reference voltage not higher than the voltage of the pad. The SCR is coupled to the voltage-sharing circuit and comprises a first n-type MOS transistor. Moreover, a first n-type MOS transistor comprising a gate is used to trigger the SCR for releasing an ESD stress according to the reference voltage.

Accordingly, different circuit structures are provided for implementing the voltage-sharing circuit of the present invention, wherein the main concept involves that the voltage-sharing circuit generates a reference voltage not higher than the VDD to prevent rapid aging of the gate oxide. The voltage-sharing circuit of the present invention comprises diodes, resisters, capacitors etc. connected in series, and the reference voltage comprises the voltage at one of the connection nodes of the devices.

BRIEF DESCRIPTION OF THE DRAWINGS

The following detailed description, given by way of examples and not intended to limit the invention solely to the embodiments described herein, will best be understood in conjunction with the accompanying drawings, in which.

DETAILED DESCRIPTION OF THE PREFERRED EMBODIMENTS

Figure 1:
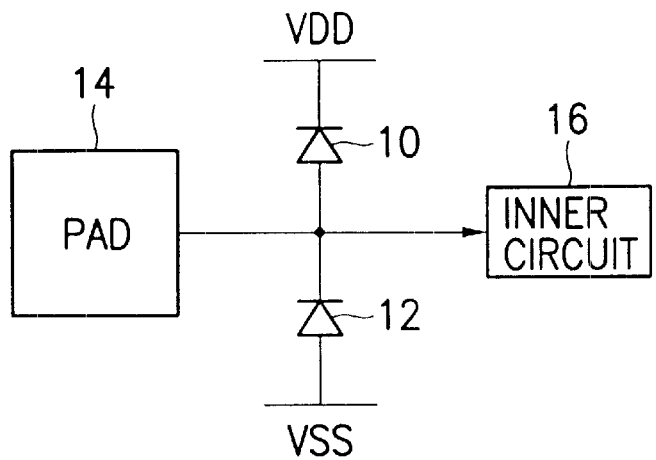
FIG. 1 illustrates an input buffer of a prior art.
Figure 2:
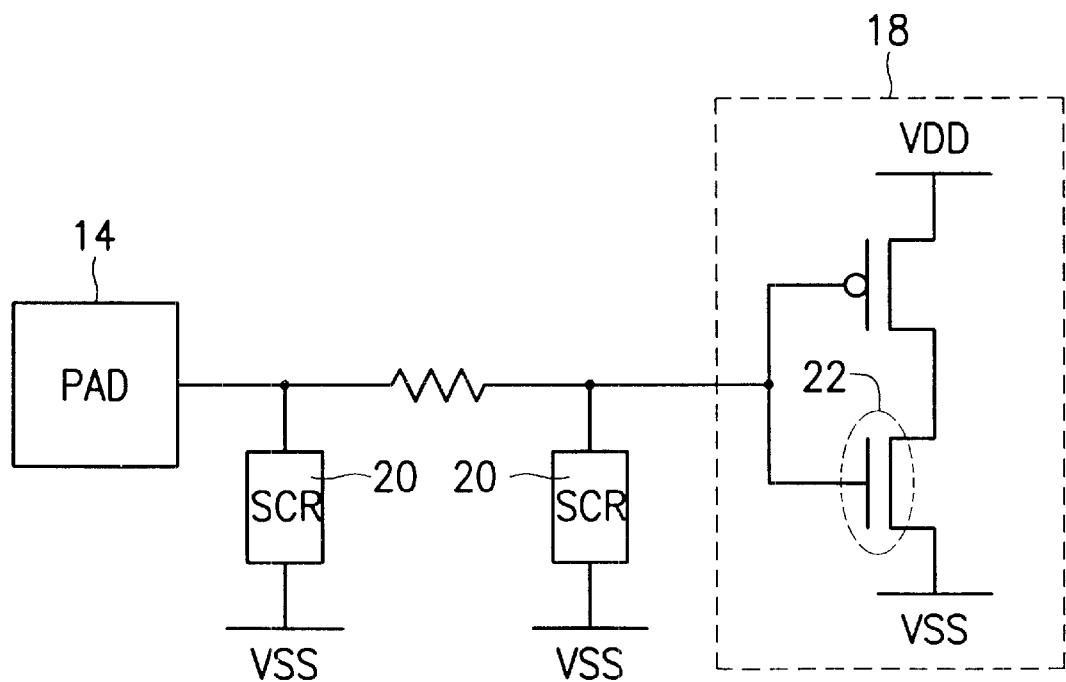
FIG. 2 illustrates an input buffer of another prior art having two semiconductor control rectifiers (SCRs)
Figure 3:
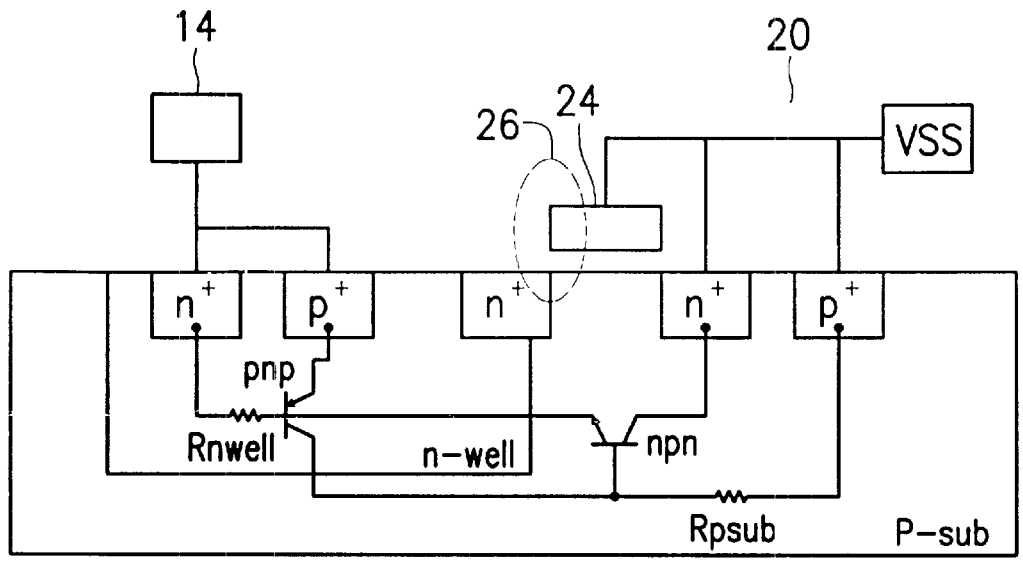
FIG. 3 is a cross-section of one of the semiconductor control rectifier shown in FIG. 2.
Figure 4:
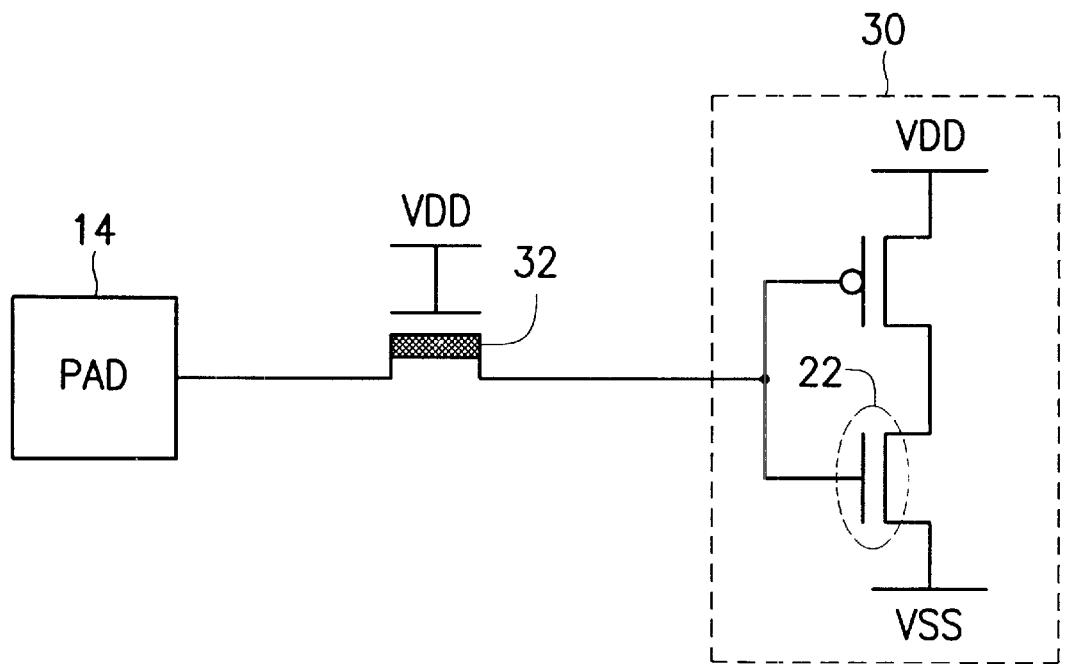
FIG. 4 illustrates a high-voltage tolerance input buffer of still another prior art.
Figure 5:
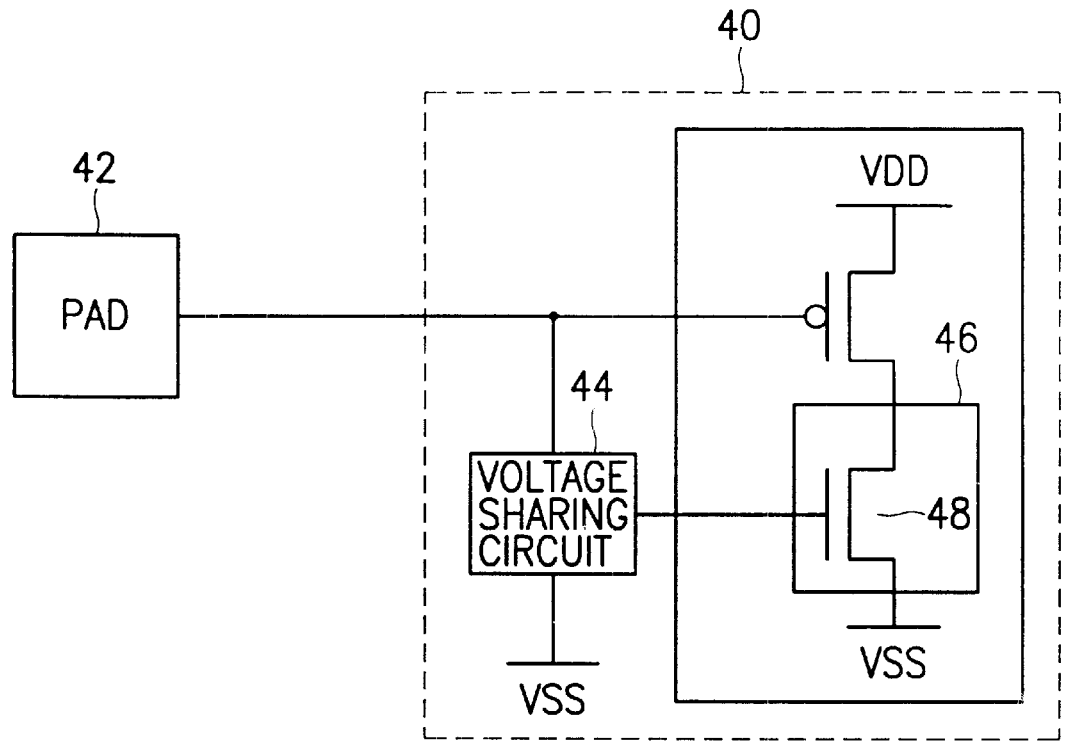
FIG. 5 illustrates a high-voltage tolerance input buffer according to an embodiment of the present invention.

Referring to FIG. 5, FIG. 5 illustrates a high-voltage tolerance input buffer according to an embodiment of the present invention The high-voltage tolerance input buffer 40 according to the present invention is coupled to a pad 42 of an integrated circuit (IC), and said high-voltage tolerance input buffer 40 comprises a voltage-sharing circuit 44 and a switch circuit 46. The voltage-sharing circuit 44 is coupled between the pad 42 and a relative-low power rail VSS, and said voltage-sharing circuit 44 generates a reference voltage not higher than the voltage of the pad 42. Further, the switch circuit 46, which is implemented by a NMOS 48 switch as shown in FIG. 5, is coupled to the voltage-sharing circuit 44, and said switch circuit 46 comprises a control gate, such as the gate of the NMOS 48, to control the switching operation of the switch circuit 46 according to the reference voltage.

For example, the switch circuit 46 shown in FIG. 5 comprises a complementary metal oxide semiconductor (CMOS) inverter having a PMOS and a NMOS 48 connected in series, and the control gate provided for the switching operation is the gate of the NMOS 48. Typically, two power rails, VDD and VSS, are connected to a power source to provide electrical power to the ICs. If the switch circuit 46 is properly designed to generate a reference voltage that is neither higher than the voltage of the pad 42 nor the voltage of the relative-high power rail VDD, then rapid aging of the gate oxide can not occur at the NMOS 48.

Figure 6:
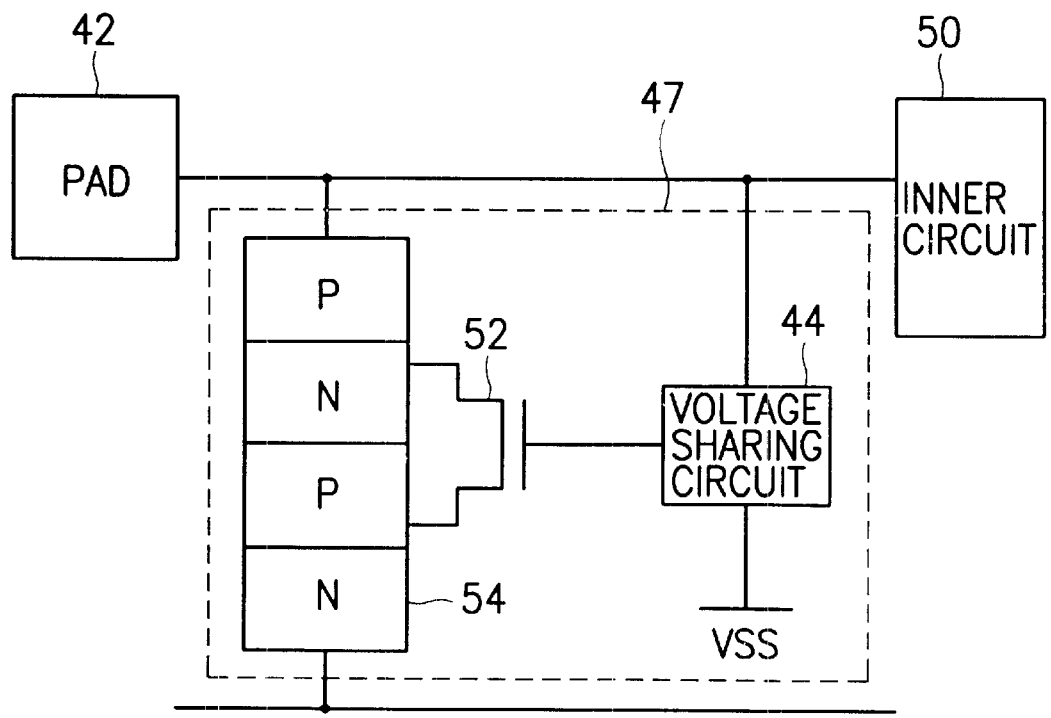
FIG. 6 illustrates a high-voltage tolerance ESD protection circuit according to another embodiment of the present invention.

Referring to FIG. 6, FIG. 6 illustrates a high-voltage tolerance ESD protection circuit 47 according to another embodiment of the present invention. In particular, it is another object of the present invention to release ESD stress at the pad 42 by providing a high-voltage tolerance ESD protection circuit 47. As shown in FIG. 6, the high-voltage tolerance ESD protection circuit 47 is coupled to the pad 42 and an inner circuit 50 and comprises a voltage-sharing circuit 44 and a semiconductor control rectifier (SCR) 54. Furthermore, the voltage-sharing circuit 44 is coupled between the pad 42 and a relative-low power rail VSS and generates a reference voltage not higher than the voltage of the pad 42. The SCR 54 is coupled to the voltage-sharing circuit and comprises a NMOS 52, wherein the NMOS 52 comprises a gate to trigger the SCR 54 to release the ESD stress at the pad 42 according to the reference voltage.

Figure 7:
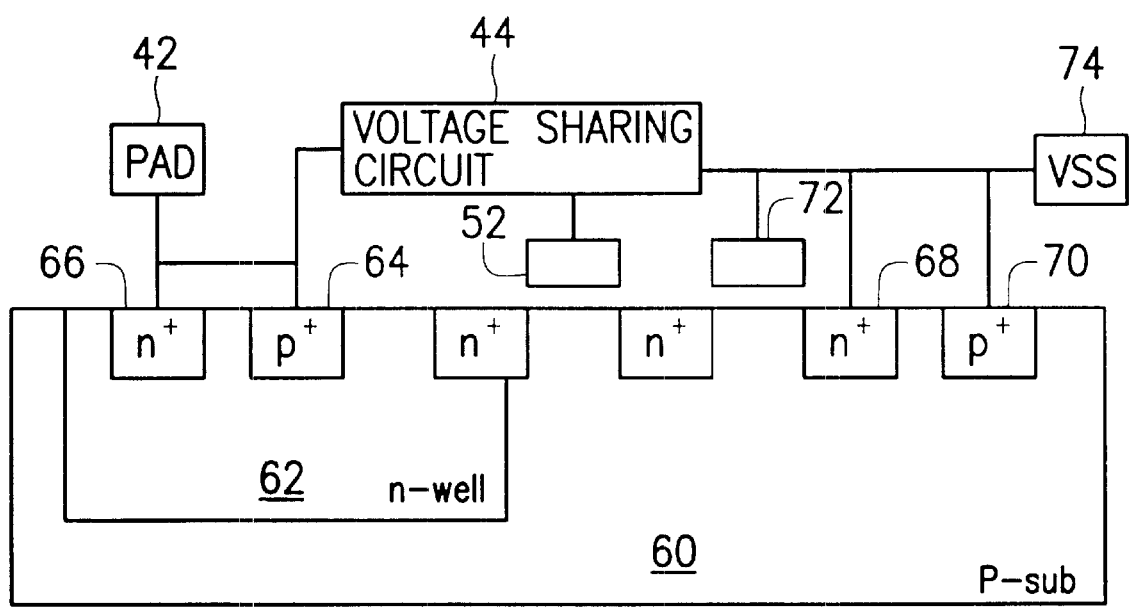
FIG. 7 is a cross-section of a SCR shown in FIG. 6.

FIG. 7 is a cross-section of the SCR shown in FIG. 6 Referring to FIG. 7, the SCR comprises a p-type substrate (p-sub 60), an n-type well (n-well 62), a p-type doped region (p+ region 64), an n-type contact region (n+ region 66), an n-type doped region (n+ region 68), a p-type contact region (p+ region 70), the first n-type MOS transistor (NMOS 52), and a second n-type MOS transistor (NMOS 72). The n-well 62 is positioned on the p-sub 60 to form a PN junction, wherein the NMOS 52 has a source/drain positioned on the PN junction. The p+ region 64 is positioned in the n-well 62. The n+ region 66 is positioned in the n-well 62 and coupled with both the p+ region 64 and the pad 42. Furthermore, the n+ region 68 is positioned on the p-sub 60. The p+ region 70 is positioned on the p-sub 60 and is coupled with both the n+ region 68 and the relative-low power rail VSS 74. The NMOS 72 is connected in series with the NMOS 52 and positioned on the surface of the p-sub 60 between the NMOS 52 and the n+ region 68. The n+ region 68 also acts as a source/drain of the NMOS 72, which is coupled with both the gate of the NMOS 72 and the relative-low power rail VSS 74.

In addition, several circuit structures are provided to implement the voltage-sharing circuit 44 of the present invention. The main concept relies on that a reference voltage generated by the voltage-sharing circuit 44 to be not higher than the VDD in order to prevent rapid aging of the gate oxide. More specifically, the structures of the voltage-sharing circuit 44 described hereafter are in reference to the high-voltage tolerance ESD protection circuit shown in FIG. 7. However, by referring to the following embodiment, it would become apparent that the same structures can be applied to the high-voltage input buffer shown in FIG. .5.

Figure 8A:
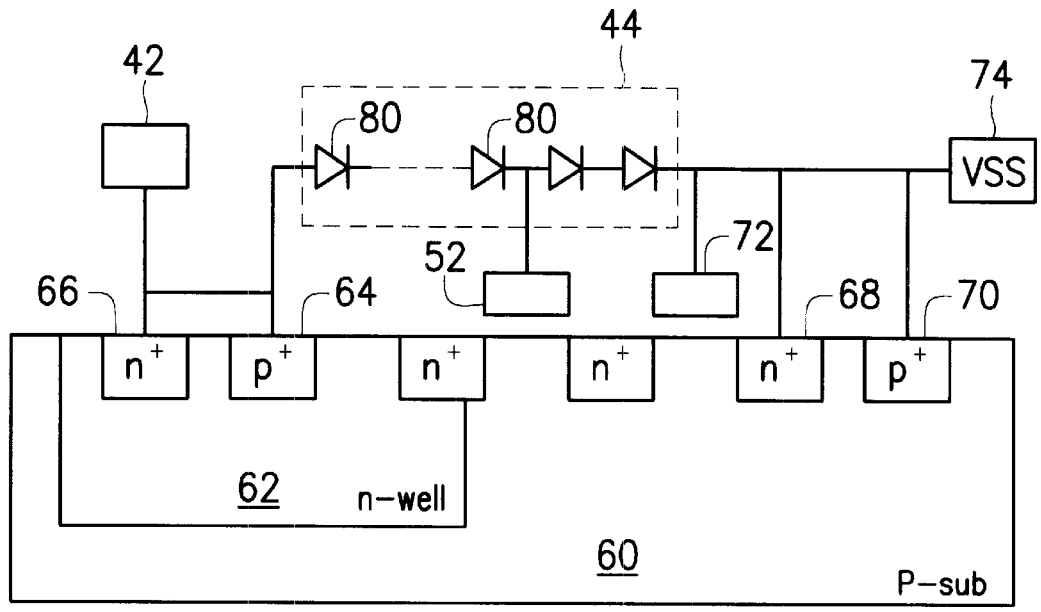
FIG. 8a illustrates the high-voltage tolerance ESD protection circuit in FIG. 7 where the voltage-sharing circuit comprises a plurality of diodes.

Referring to FIG. 8a, FIG. 8a illustrates the high-voltage tolerance ESD protection circuit shown in FIG. 7 where the voltage-sharing circuit comprises a plurality of diodes. The voltage-sharing circuit can also be comprised of a plurality of diodes 80 connected in series. Moreover, the diodes are forwardly connected between the pad 42 and the relative-low power rail VSS 74. The reference voltage is the voltage at one of connection nodes of the diodes 80. Roughly speaking, each diode provides a voltage drop of 0.7 volt. If there are x diodes connected between the pad 42 and the gate of the NMOS 52, then the gate of the NMOS 52 will received a voltage 0.7x less than that at the pad 42.

Figure 8B:
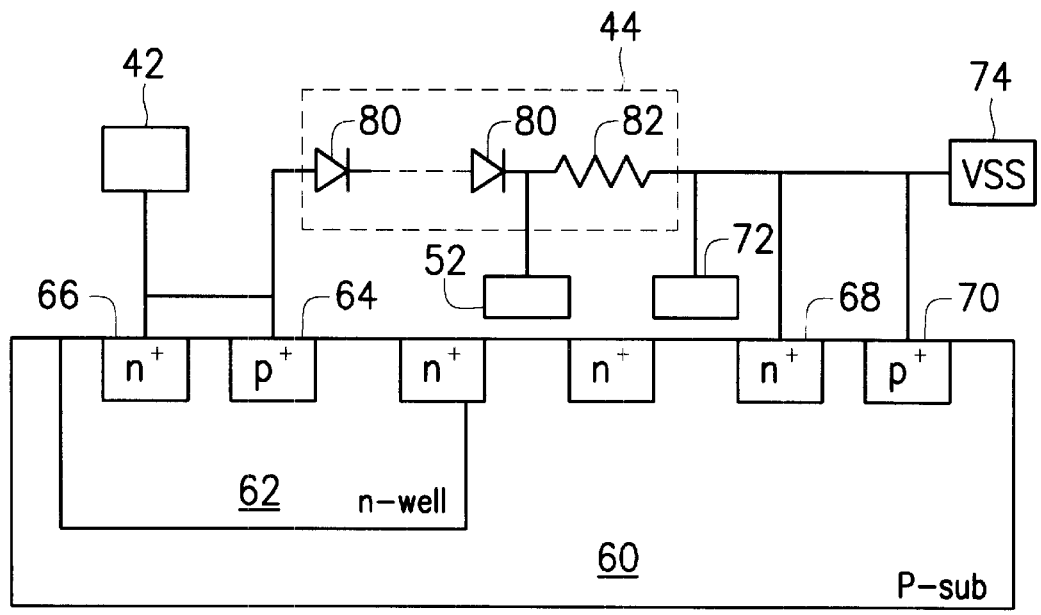
FIG. 8b illustrates the high-voltage tolerance ESD protection circuit in FIG. 7 where the voltage-sharing circuit comprises a plurality of diodes and a resistor.

Referring to FIG. 8b, FIG. 8b illustrates the high-voltage tolerance ESD protection circuit shown in FIG. 7 where the voltage-sharing circuit comprises a plurality of diodes and a resistor. The voltage-sharing circuit 44 can also be comprised of a plurality of diodes 80 connected in series and a resistor 82. Moreover, the diodes 80 are connected in between the pad 42 and the gate of the NMOS 52 while the resistor 82 is connected between the relative-low power rail VSS 74 and the gate of the NMOS 52. The reference voltage is the voltage measured at the connection node between the diodes 80 and the resistor 82.

Figure 8C:
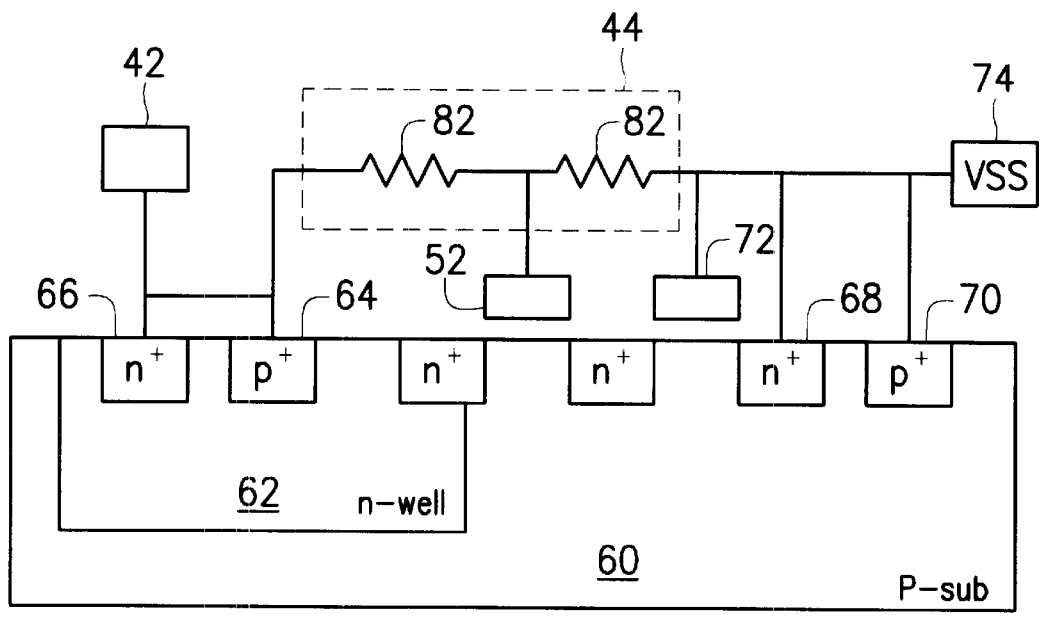
FIG. 8c illustrates the high-voltage tolerance ESD protection circuit in FIG. 7 where the voltage-sharing circuit comprises a plurality of resistors.

Referring to FIG. 8c, FIG. 8c illustrates the high-voltage tolerance ESD protection circuit shown in FIG. 7 where the voltage-sharing circuit comprises a plurality of resistors. The voltage-sharing circuit 44 can also be comprised of a plurality of resistors 82 connected in series between the pad 42 and the relative-low power rail VSS 74. The reference voltage is the voltage measured at the connection node between the resistors 82.

The above-mentioned diodes 80 can also be PN junction diodes, MOS transistor diodes, Schockty diodes or any combination of the above.

Figure 8D:
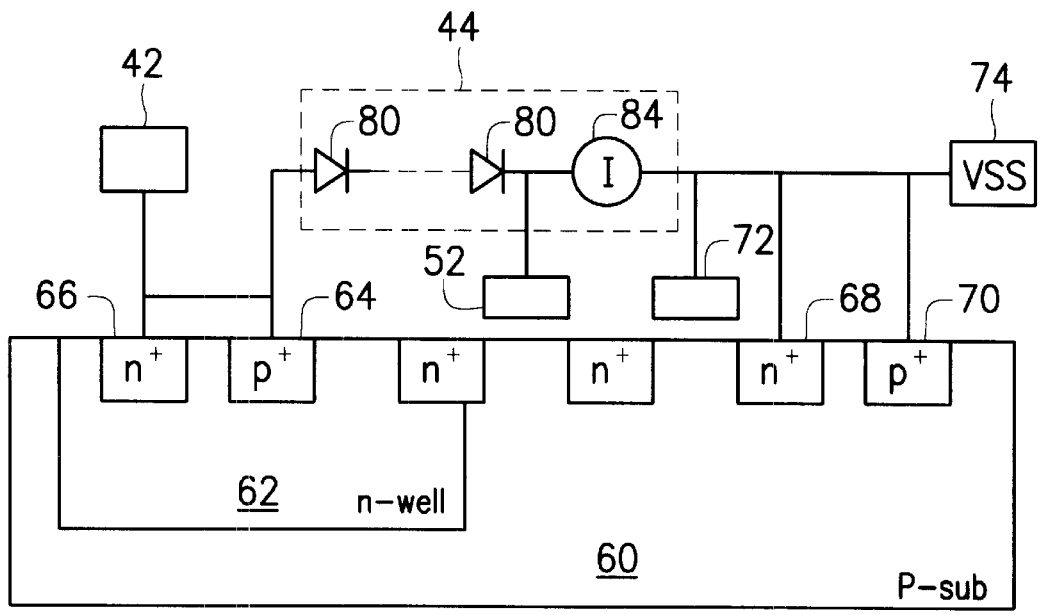
FIG. 8d illustrates the high-voltage tolerance ESD protection circuit in FIG. 7 where the voltage-sharing circuit comprises a plurality of diodes and a current source.

Referring to FIG. 8d, FIG. 8d illustrates the high-voltage tolerance ESD protection circuit shown in FIG. 7 where the voltage-sharing circuit comprises a plurality of diodes 80 and a current source 84. The voltage-sharing circuit 44 can also be comprised of a plurality of diodes 80 and a current source 84 connected in series. The reference voltage is the voltage measured at the connection node between the diodes 80 and the current source 84.

Figure 8E:
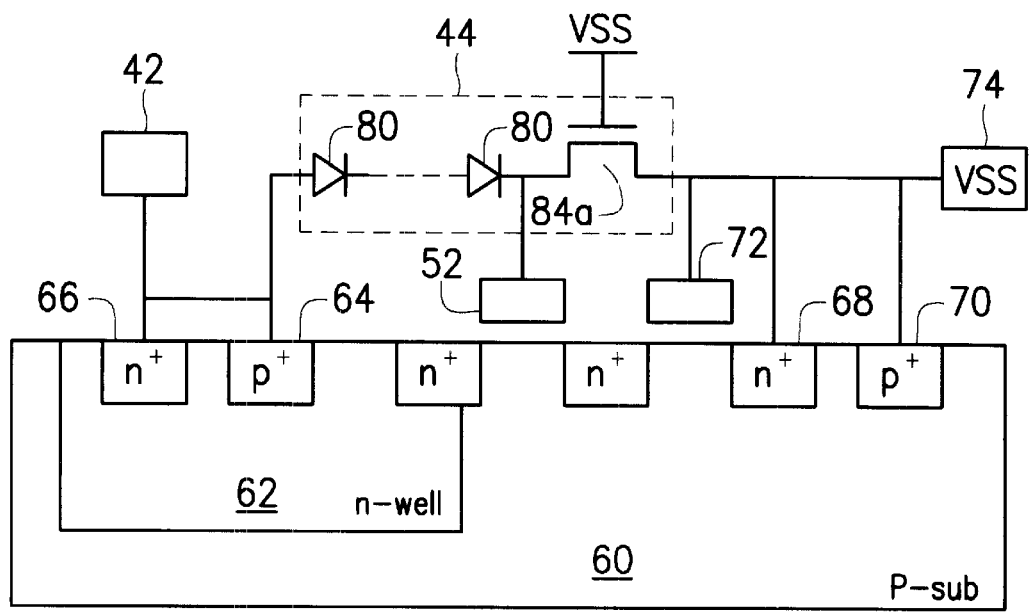
FIG. 8e and FIG. 8f illustrate two embodiments of the high-voltage tolerance ESD protection circuit shown in FIG. 8d.
Figure 8F:
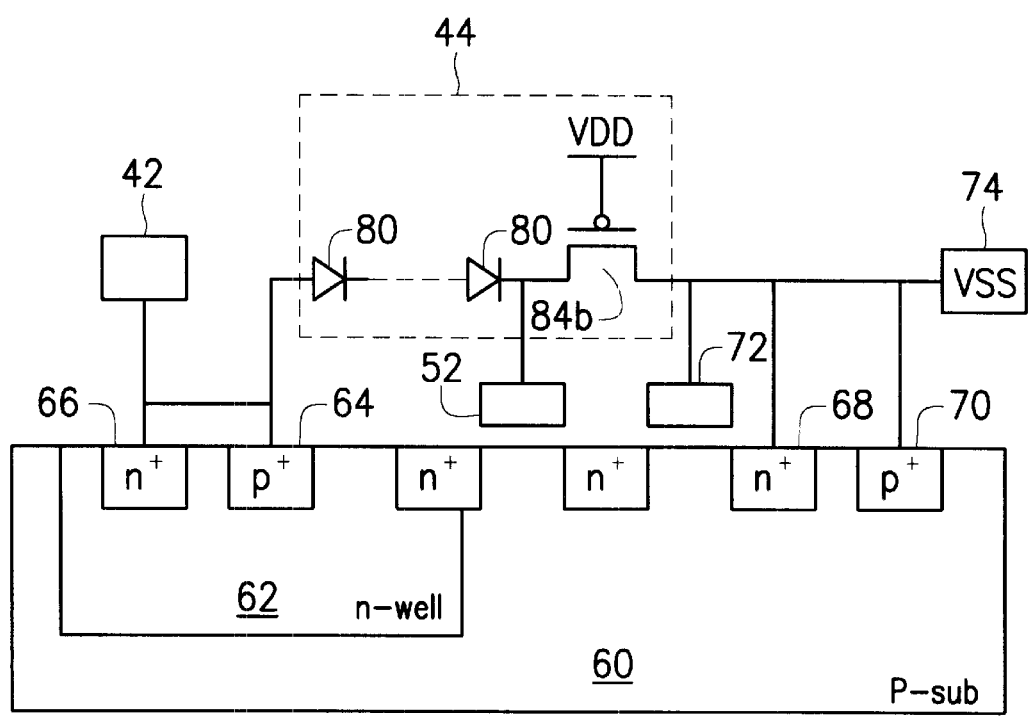

The above-mentioned current source 84 can be a MOS transistor such as the NMOS 84a shown in FIG. 8e or the PMOS 84b shown in FIG. 8f. In addition, the MOS transistor comprises two sets of source/drain such that one set of source/drain is connected to a terminal of the diodes connected in series and the other set being connected to the relative-low power rail VSS 74. Further, the MOS transistor is biased by a sub-threshold region, i.e. the MOS transistor is turned off. For example, the gate of the NMOS 84a shown in FIG. 8e is connected to the relative-low power rail VSS 74 while the gate of the PMOS 84b shown in FIG. 8f is connected to the relative-high power rail VDD.

Figure 8G:
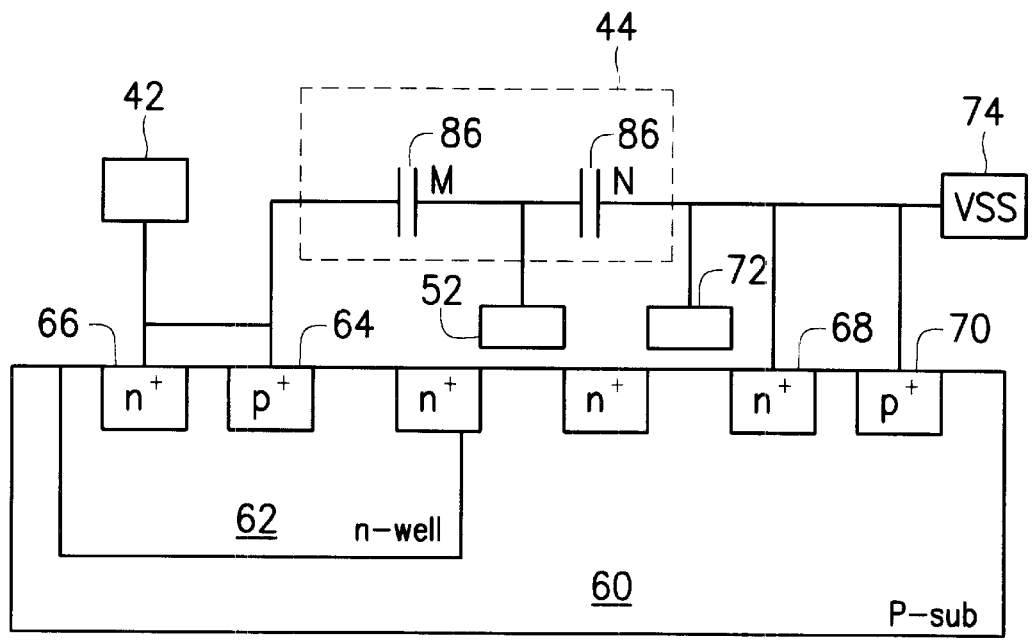
FIG. 8g illustrates the high-voltage tolerance ESD protection circuit in FIG. 7 where the voltage-sharing circuit comprises two capacitors.

Referring to FIG. 8g, FIG. 8g illustrates the high-voltage tolerance ESD protection circuit shown in FIG. 7 where the voltage-sharing circuit comprises two capacitors 86 connected in series, and the reference voltage is the voltage measured at the connection node between the capacitors 86. For example, if one of the capacitors 86 has a capacitance of M while the other has a capacitance of N, as shown in FIG. 8g, then the level of the reference voltage can be calculated by multiplying the voltage at the pad 42 by M/(M+N).

Figure 8H:
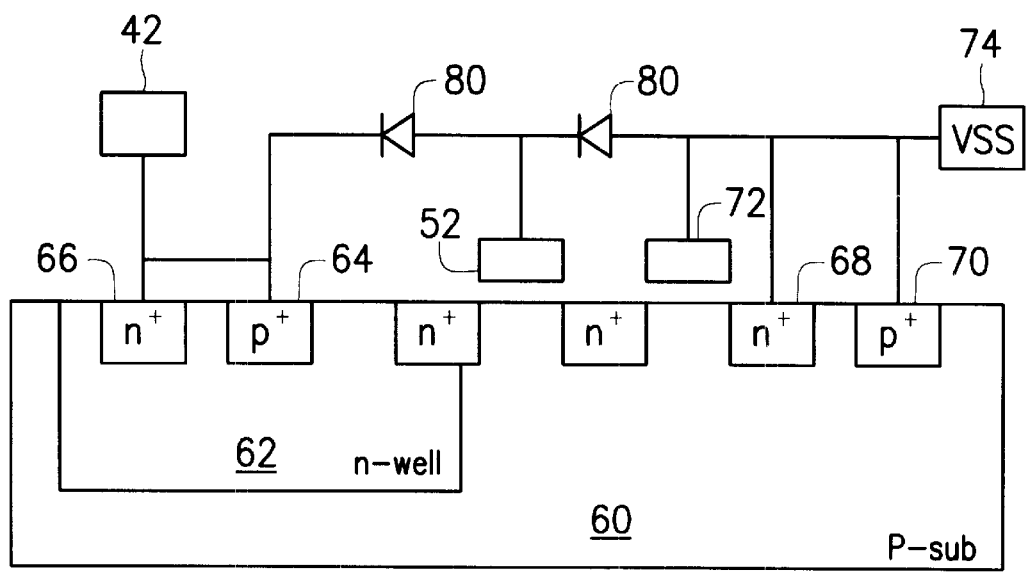
FIG. 8h illustrates an embodiment of the capacitors shown in FIG. 8g.

Furthermore, a bigger capacitance can be obtained to prevent white noise disturbance, wherein each of the capacitors shown in FIG. 8g can further comprises a diode at reverse-bias, as shown in FIG. 8h, and wherein each diode can be formed by an n-well and a p+ region in the n-well in order to gain a better capacitance control.

The high-voltage tolerance input buffer according to the present invention employs a voltage-sharing circuit to provide a reduced voltage from the pad to the switch circuit in order to control the switching operation of the switch circuit. Thus, even when an external circuit provides a signal having a voltage higher than the relative-high voltage rail VDD of the IC, the switch circuit will not be suffering from rapid aging of the gate oxide. Furthermore, the high-voltage tolerance ESD protection circuit according to the present invention will not be suffering from any over-stress problem since the voltage level at the gate of the NMOS for triggering is lessened by the voltage-sharing circuit.

In contrast to the high-voltage tolerance input buffer of the prior arts, the high-voltage tolerance input buffer according to the present invention can be implemented without incurring any change in the original process flow by employing a voltage-sharing circuit for solving the rapid aging problem of gate oxide.

While the invention has been described by way of examples and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A high-voltage tolerance electrostatic discharge (ESD) protection circuit connected to a pad of an integrated circuit, comprising:
    a voltage-sharing circuit connected between the pad and a power rail for generating a reference voltage not higher than the voltage of the pad; and
    a semiconductor controlling rectifier (SCR) coupled to the voltage-sharing circuit, comprising:
    a first n-type MOS transistor, wherein the first n-type MOS transistor further comprises a gate coupled to the reference voltage to improve the triggering of the semiconductor controlling rectifier during an ESD event,
    a p-type substrate;
    an n-type well disposed on the p-type substrate to form a PN junction, wherein the first n-type MOS Transistor further comprises a source/drain disposed on the PN junction;
    a p-type doped region disposed in the n-type well;
    an n-type contact region disposed in the n-type well, connected to both the p-type doped region and the pad;
    an n-type doped region disposed on the p-type substrate;
    a p-type contact region disposed on the p-type substrate, connected to both the n-type doped region and the power rail; and
    a second n-type MOS transistor connected in series with the first n-type MOS transistor, disposed on the surface of the substrate between the first n-type MOS transistor and the n-type doped region.

2. The high-voltage tolerance ESD protection circuit of claim 1, wherein the circuit is powered by a power source, and wherein the reference voltage is not higher than the voltage provided by the power source.

3. The high-voltage tolerance ESD protection circuit of claim 1, wherein the voltage-sharing circuit comprises a plurality of diodes connected in series, and wherein the reference voltage is the voltage measured at one of the connection nodes of the diodes.

4. The high-voltage tolerance ESD protection circuit of claim 3, wherein the diodes are PN junction diodes, MOS transistor diodes, Schockty diodes, or any combination of the above.

5. The high-voltage tolerance ESD protection circuit of claim 1, wherein the voltage-sharing circuit comprises a plurality of diodes and a resistor connected in series, and wherein the reference voltage is the voltage measured at the connection node between the diodes and the resistor.

6. The high-voltage tolerance ESD protection circuit of claim 1, wherein the voltage-sharing circuit comprises two resistors connected in series, and wherein the reference voltage is the voltage measured at the connection node between the resistors.

7. The high-voltage tolerance ESD protection circuit of claim 1, wherein the voltage-sharing circuit comprises a plurality of diodes and a current source connected in series, and wherein the reference voltage is the voltage measured at the connection node between the diodes and the current source.

8. The high-voltage tolerance ESD protection circuit of claim 7, wherein the current source is a MOS transistor comprising a first source/drain connected to the diodes and a second source/drain connected to the power rail, and wherein the MOS transistor is biased by a sub-threshold region.

9. The high-voltage tolerance ESD protection circuit of claim 1, wherein the voltage-sharing circuit comprises two capacitors connected in series, and wherein the reference voltage is the voltage measured at the connection node between the capacitors.

10. The high-voltage tolerance input buffer of claim 9, wherein each of the capacitors comprises a diode at reverse-bias.

* * * * *